US005467769A

United States Patent [19]

Yoshino et al.

[11] Patent Number: 5,467,769
[45] Date of Patent: Nov. 21, 1995

[54] MAGNETIC FIELD GENERATING APPARATUS

[75] Inventors: Hitoshi Yoshino, Kashiwa; Shigeo Hashimoto, Nishinomiya, both of Japan

[73] Assignees: Hitachi Medical Corporation, Tokyo; Sumitomo Special Metals Co., Ltd., Osaka, both of Japan

[21] Appl. No.: 197,277

[22] Filed: Feb. 16, 1994

[30] Foreign Application Priority Data

Feb. 19, 1993 [JP] Japan .................. 5-030645

[51] Int. Cl.⁶ .................................. A61B 5/055
[52] U.S. Cl. .................... 128/653.2; 128/653.5; 324/318; 335/302; 335/306
[58] Field of Search .................. 128/653.2, 653.5; 324/318–320, 322; 335/296, 302, 306

[56] References Cited

U.S. PATENT DOCUMENTS

| | | | |
|---|---|---|---|
| 4,695,802 | 9/1987 | Zijlstra | 324/318 X |
| 4,777,464 | 10/1988 | Takabatashi et al. | 324/318 X |
| 4,931,760 | 6/1990 | Yamaguchi et al. | 324/319 |
| 4,937,545 | 6/1990 | Chaillout et al. | 335/306 X |
| 4,953,555 | 9/1990 | Leupold et al. | 335/306 X |
| 4,998,976 | 3/1991 | Rapoport | 324/318 X |
| 5,028,902 | 7/1991 | Leupold et al. | 335/306 |
| 5,089,798 | 2/1992 | Miyata | 335/306 |
| 5,134,374 | 7/1992 | Breneman et al. | 324/318 X |
| 5,204,628 | 4/1993 | Konishi et al. | 324/318 X |
| 5,334,966 | 8/1994 | Takeshima et al. | 335/306 |

*Primary Examiner*—William E. Kamm
*Assistant Examiner*—Brian L. Casler
*Attorney, Agent, or Firm*—Antonelli, Terry, Stout & Kraus

[57] ABSTRACT

A magnetic field generating apparatus has a permanent magnet arrangement for generating a magnetic field in a magnetic field generating space and a yoke arrangement for forming magnetic circuits for generation of the magnetic field together with the permanent magnet arrangement. The yoke arrangement includes a first pair of yokes arranged facing each other, a second pair of yokes arranged facing each other through which the first pair of yokes are magnetically connected to each other, a third pair of yokes arranged between one end of one of the first pair of yokes and one end of one of the second pair of yokes and between the other end of the one of the first pair of yokes and one end of the other of the second pair of yokes, respectively, and yoke moving units for independently moving the one of the first pair of yokes and each of the second pair of yokes with respect to the third pair of yokes, respectively.

15 Claims, 4 Drawing Sheets

MAGNETIC FIELD GENERATING APPARATUS

BACKGROUND OF THE INVENTION

This invention relates to a magnetic field generating apparatus, and in particular to a magnetic field generating apparatus suitable for use with a magnetic resonance imaging system.

According to a magnetic resonance imaging system, an object to be inspected, such as a human body or a human head, is placed in a static magnetic field. A radio frequency pulse is applied to the object while applying magnetic field gradients to the static magnetic field to generate from the object a magnetic resonance signal, which is processed to obtain an image of the object.

In order to carry out the magnetic resonance imaging, it is necessary for the static magnetic field to have a strength in the order of 0.05–2.0 T (tesla) and a magnetic field homogeneity of the order of 10 ppm or less in the measuring spherical region of 30 to 50 cm diameter. The static magnetic field may be generated by a resistive magnet, superconductive magnet or permanent magnet.

A typical permanent magnet used for magnetic resonance imaging is disclosed in Japanese patent application laid-open No. 177903/1987. The disclosed permanent magnet comprises a permanent magnet arrangement for generating a static magnetic field in a measuring space in which an object to be inspected is arranged and a yoke arrangement having its polygonal section arranged around the permanent magnet arrangement for forming magnetic circuits for generation of the static magnetic field together with the permanent magnet arrangement.

However, no attention is given in this construction to the need for adjusting the static magnetic field homogeneity, such as by moving the yoke arrangement.

SUMMARY OF THE INVENTION

An object of the present invention is to provide a magnetic field generating apparatus capable of improving the magnetic field homogeneity.

Another object of the present invention to provide a magnetic field generating apparatus capable of improving the magnetic field homogeneity by moving the yoke means without substantially weakening the strength of the magnetic field.

An additional object of the present invention is to provide a magnetic field generating apparatus capable of facilitating adjustment of the magnetic field homogeneity.

According to the present invention, a magnetic field generating apparatus having a magnetic field generating space comprises a permanent magnet arrangement for generating a magnetic field in the magnetic field generating space and a yoke arrangement for forming magnetic circuits for generation of the magnetic field together with the permanent magnet arrangement, the yoke arrangement including a first pair of yokes arranged so as to be facing each other, a second pair of yokes arranged so as to be facing each other and through which the first pair of yokes are magnetically connected to each other, a third pair of yokes arranged between one end of one of the first pair of yokes and one end of one of the second pair of yokes and between the other end of the one of the first pair of yokes and one end of the other of the second pair of yokes, respectively, and yoke moving units for independently moving the one of the first pair of yokes and each of the second pair of yokes with respect to the third pair of yokes, respectively.

These and other objects and features of the present invention will become apparent from the descriptions of preferred embodiments of the present invention taken in connection with the accompanying drawings.

DESCRIPTION OF THE PREFERRED EMBODIMENTS

Figure 1:
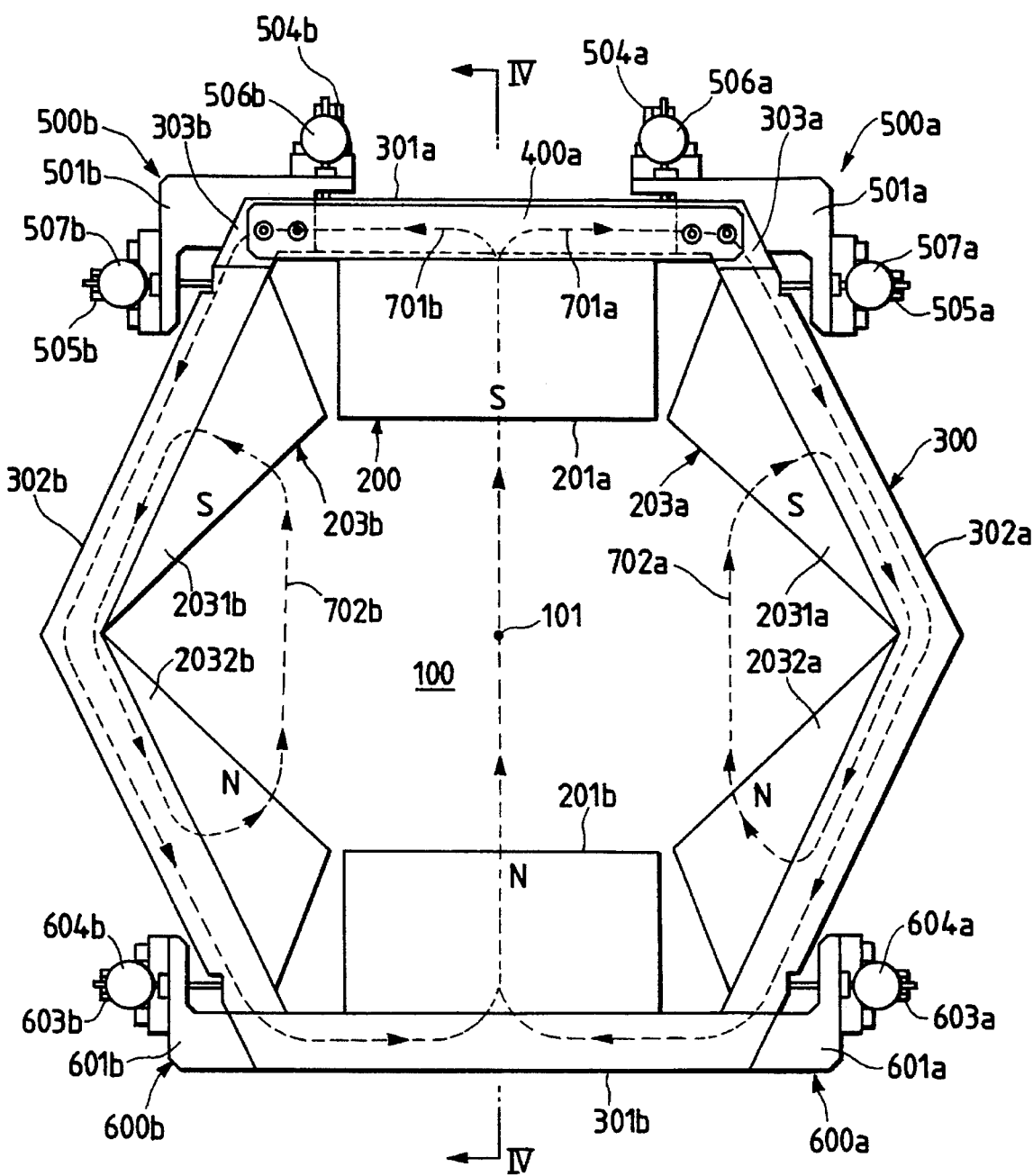
FIG. 1 is an elevation view of a magnetic field generating apparatus showing an embodiment according to the present invention.

Referring to FIGS. 1 to 5 showing an embodiment of the present invention, a magnetic field generating apparatus comprises a permanent magnet arrangement 200 for generating a uniform magnetic field in a magnetic field generating through-hollow space 100 having a center axis 101, and a yoke arrangement 300 for forming magnetic circuits for generation of the magnetic field together with the permanent magnet arrangement 200.

The permanent magnet arrangement 200 comprises a pair of main permanent magnets 201a and 201b arranged so as to be facing each other and a pair of auxiliary permanent magnet units 203a and 203b.

The yoke arrangement 300 has a convex hexagonal cross-section, as a whole, so as to be which comprises a first pair of yokes 301a and 301b, arranged facing each other, a second pair of yokes 302a and 302b through which the first pair of yokes 301a and 301b are magnetically connected to each other and a third pair of yokes 303a and 303b arranged between one end of the yoke 301a and the yoke 302a and between the other end of the yoke 301a and one end of the yoke 302b, respectively.

A first side of the hexagon is occupied or constituted by the yoke 301a and the third pair of yokes 303a and 303b, while a second side of the hexagon, opposite to the first side thereof, is occupied or constituted by the yoke 301b. First adjacent sides of the remaining four sides of the hexagon are constituted by the yoke 302a, while second adjacent sides of the hexagon opposite to the first adjacent sides thereof are constituted by the yoke 302b.

The yoke 301a is provided with end surfaces 3011a and 3011b parallel to each other, which are in close contact with the third pair of yokes 303a and 303b, respectively. The yoke 302a is provided with end surfaces 3021a and 3022a, which are parallel to each other, which are in close contact with the yoke 303a and the yoke 301b, respectively. Likewise, the yoke 302b is provided with end surfaces 3021b and 3022b parallel to each other, and which are in contact with the yoke 303b and the yoke 301b, respectively.

The pair of main permanent magnets 201a and 201b are supported by the first pair of yokes 301a and 301b so as to be brought into close contact with the inner surfaces thereof, respectively, and are so magnetized as to form main magnetic circuits 701a and 701b together with the yoke arrangement 300, as shown in FIG. 1, thus generating a main magnetic field directed from the main permanent magnet 201b to the main permanent magnet 201a. The auxiliary permanent magnet unit 203a comprises a pair of auxiliary permanent magnets 2031a and 2032a, each having a scalene triangle section, which are supported by the yoke 302a so as to be brought into close contact with the inner surface thereof, and are so magnetized as to form an auxiliary magnetic circuit 702a together with the yoke 302a, as shown in FIG. 1, thus generating an auxiliary magnetic field having the same direction as that of the main magnetic field. Likewise, the auxiliary permanent magnet unit 203b comprises a pair of auxiliary permanent magnets 3031b and 2032b, each having a scalene triangle section, which are supported by the yoke 302b so as to be brought into close contact with the inner surface thereof, and are so magnetized as to form an auxiliary magnetic circuit 702b together with the yoke 302b, as shown in FIG. 1, thus generating another auxiliary magnetic field having the same direction as that of the main magnetic field.

Therefore, it will be understood that the uniform magnetic field generated by the permanent magnet arrangement 200 is composed of a combined magnetic field including the main magnetic field generated by the pair of main permanent magnets 201a and 201b and the auxiliary magnetic fields generated by the pair of auxiliary permanent magnet units 203a and 203b.

The end surfaces 3011a and 3011b, which are parallel to each other, are also parallel to the direction of the magnetic field generated by the permanent magnet arrangement 200, while, the end surfaces 3021a and 3022a, which are parallel to each other and the end surfaces 3021b and 3022b, which are parallel to each other, are all perpendicular to the direction of the magnetic field generated by the permanent magnet means 200, respectively.

The third pair of yokes 303a and 303b are mechanically connected firmly to each other at their respective ends by means of a pair of connecting members 400a and 400b.

Figure 3:
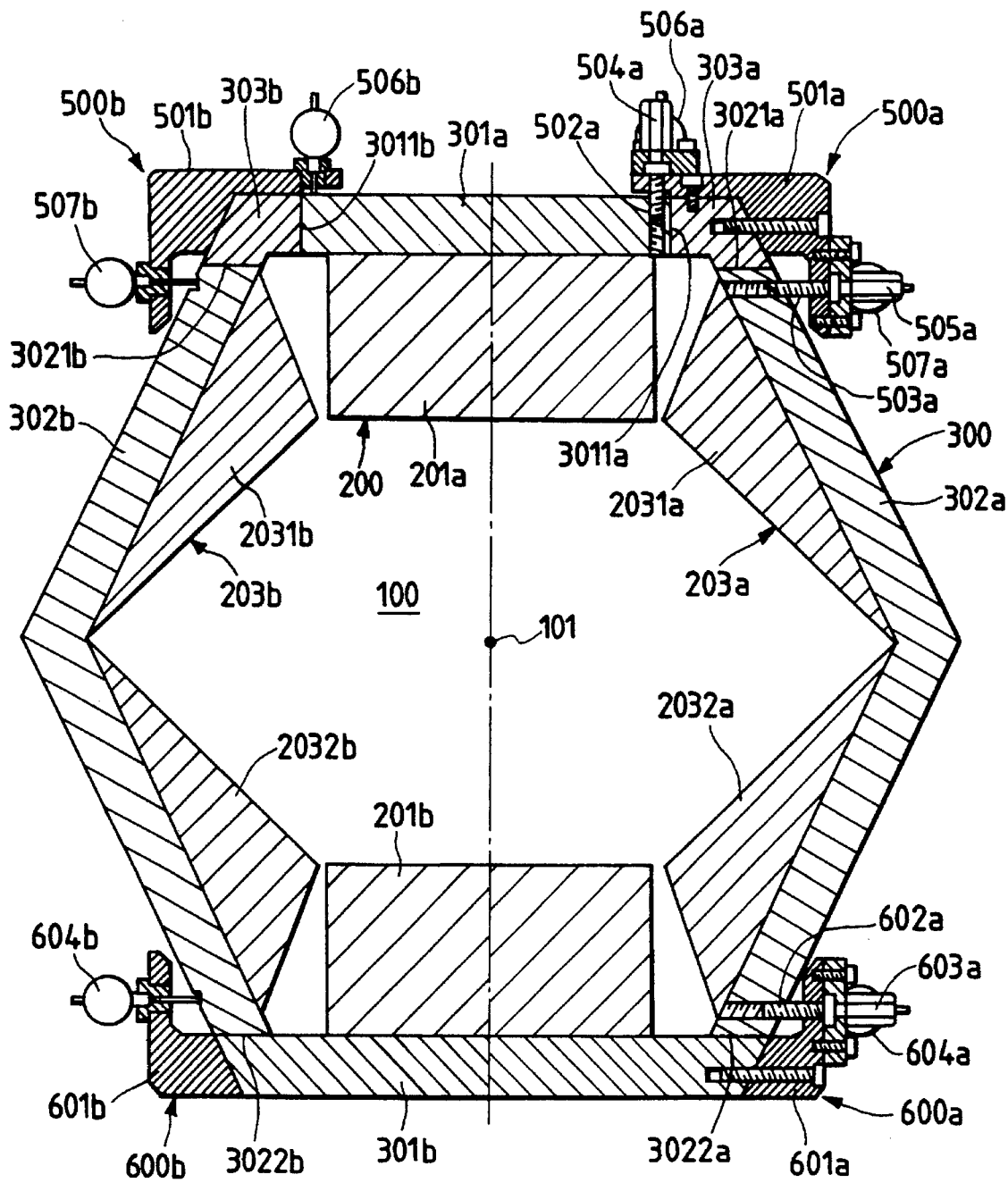
FIG. 3 is a composite sectional view, a left-hand half of which shows a sectional view taken along line IIIA—IIIA in FIG. 2 and a right-hand half of which shows a sectional view along taken line IIIB—IIIB in FIG. 2.
Figure 4:
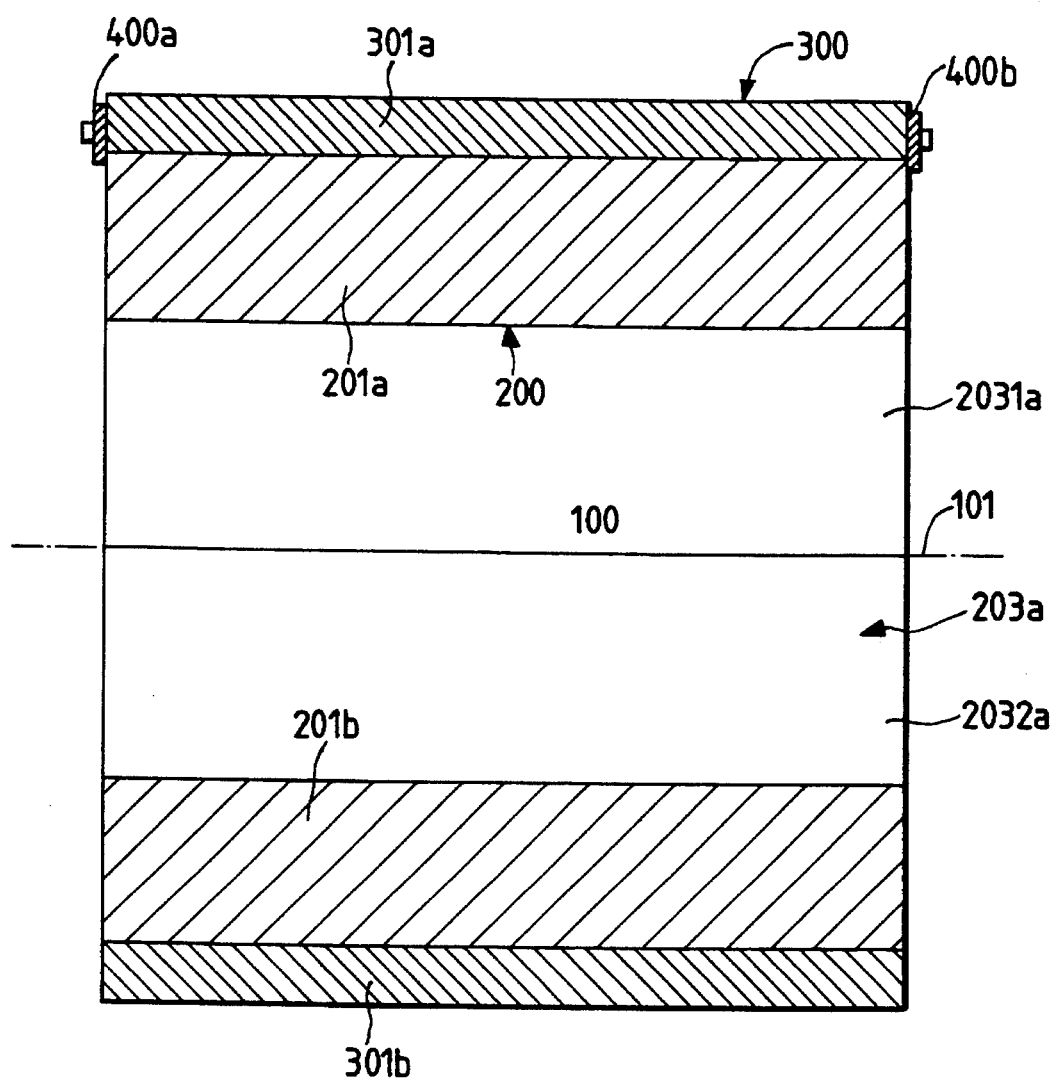
FIG. 4 is a sectional view taken along line IV—IV in FIG. 1.

The yoke 303a is provided with yoke moving units 500a at both end portions thereof, each of which comprises a support 501a secured to the yoke 303a by means of screws, adjusting screws 502a and 503a supported by the support 501a and which are capable of rotating, but are prevented from moving in the axial direction, and knobs 504a and 505a integrated with the adjusting screws 502a and 503a for rotating them, respectively. The above described elements, members or parts of the yoke moving units 500a are made of nonmagnetic materials for preventing any effect by them on the uniform magnetic field established in the magnetic field generating space 100. The adjusting screws 502a and 503a are in threaded engagement with the yokes 301a and 302a, as shown in FIG. 3, respectively. The yoke 303b is provided with yoke moving units 500b at both end portions thereof, which units have the same construction as those of the yoke 303a; however, the adjusting screws 502b and 503b are in threaded engagement with the yokes 301a and 302b, respectively.

Each of the yoke moving units 500a further comprises dial gauges 506a and 507a, the spindles of which are so biased as to be brought into contact with the outer surface of the yoke 301a and the outer surface of the yoke 302a, respectively. Likewise, each of the yoke moving units 500b further comprises dial gauges 506b and 507b, the spindles of which are so biased as to brought into contact with the outer surface of the yoke 301a and the outer surface of the yoke 302b, respectively.

Figure 2:
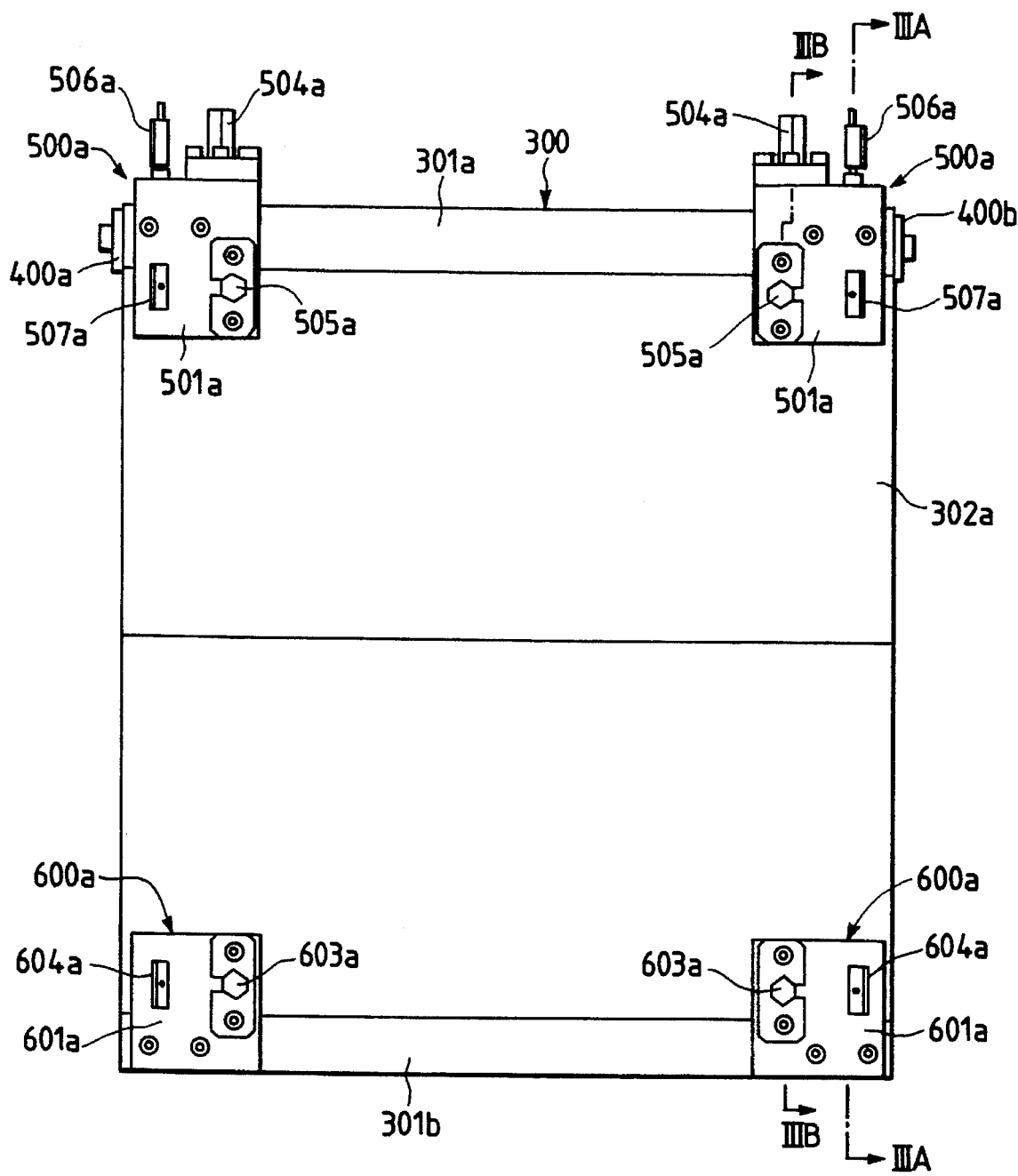
FIG. 2 is a right side view of the magnetic field generating apparatus shown in FIG. 1.

The yoke 301b is provided with two yoke moving units 600a at one end thereof for moving the yoke in a direction perpendicular to the center axis 101, which units 600a are positioned at both end portions of the one end of the yoke 301b in a direction parallel to the center axis 101, respectively, as seen in FIG. 2. Each of the yoke moving units 600a comprises a support 601a secured to the yoke 301b by means of screws, an adjusting screw 602a supported by the support 601a and which is capable of rotating, but is prevented from moving in the axial direction, and a knob 603a integrated with the screw 602a for rotating it. All the parts of the yoke moving units 600a are made of nonmagnetic materials for preventing any effect thereof on the uniform magnetic field established in the magnetic field generating space 100 by the permanent magnet means 200. The adjusting screw 602a is in threaded engagement with the yoke 302a, as shown in FIG. 3. The yoke 301b is further provided with two yoke moving units 600b at the other end thereof in the direction of the center axis 101, which are positioned at both of the end portions of the other end of the yoke 301b in the direction parallel to the center axis 101, respectively. The yoke moving units 600b are of the same construction as the yoke moving units 600a however, the adjusting screw 602b is in threaded engagement with the yoke 302b. Each of the yoke moving units 600a further comprises a dial gauge 604a, the spindle of which is so biased as to be brought into contact with the outer surface of the yoke 302a. Each of the yoke moving units 600b further comprises a dial gauge 604b, the spindle of which is so biased as to brought into contact with the outer surface of the yoke 302b.

In operation, when the knob 504a is rotated, the adjusting screw 502a is rotated together with the knob 504a while being prevented from moving in the axial direction. Because the screw 502a is in threaded engagement with the yoke 301a, the rotation of the screw 502a is converted into a rectilinear movement of the yoke 301a in a direction in which the distance between the pair of yokes 301a and 301b is varied. Likewise, the adjusting screw 502b is rotated by rotating the knob 504b integrated therewith, thus causing a rectilinear movement of the yoke 301a in the direction in which the distance between the pair of yokes 301a and 301b is varied. The pair of main permanent magnets 201a and 201b are supported by the pair of yokes 301a and 301b and thus the distance between the pair of main permanent magnets 201a and 201b may be varied by properly manipulating the knobs 504a and 504b of the four yoke moving units 500a and 500b. The homogeneity of the uniform magnetic field in the magnetic field generating space 100 is varied by varying the distance between the pair of main permanent magnets 201a and 201b. Therefore, the homogeneity of the uniform magnetic field in the magnetic field generating space 100 may be improved by suitably manipulating the four knobs 504a and 504b.

When the adjusting screws 503a and 602a are rotated by rotating the knobs 505a and 603a, respectively, the yoke 302a is moved in a direction in which the distance between the pair of yokes 203a and 203b is varied, because the adjusting screws 503a and 602a are in threaded engagement with the yoke 302a. Likewise, when the adjusting screws 503b and 603b are rotated by rotating the knobs 505b and 603b, respectively, the yoke 302b is moved in the direction in which the distance between the pair of yokes 203a and 203b is varied, because the adjusting screws 503b and 602b are in threaded engagement with the yoke 302b. The auxiliary permanent magnet unit 203a is supported by the yoke 302a, while the auxiliary permanent magnet unit 203b is supported by the yoke 302b. For this reason, the distance between the pair of auxiliary permanent magnet units 203a and 203b is varied by properly manipulating the knobs 505a and 603a and the knobs 505b and 603b. In addition, the pair of auxiliary permanent magnets 203a and 203b can be relatively moved without substantially varying the distance therebetween by properly manipulating the knobs 505a and 603a and the knobs 505b and 603b. Therefore, the homogeneity of the uniform magnetic field in the magnetic field generating space 100 may be improved by suitably manipulating the knobs 505a and 603a and the knobs 505b and 603b. In this case, it will be appreciated that the third pair of yokes 303a and 303b are kept stationary even when any of the yoke 301a and the second pair of yokes 302a and 302b are moved and that the yokes 301a, 302a and 302b can be moved independently of each other.

As described previously, the end surfaces 3011a and 3011b of the yoke 301a are parallel to each other and in close contact with the third pair of yokes 303a and 303b. Therefore, even if the yoke 301a is so moved that the distance between the first pair of yokes 301a and 301b is varied, the end surfaces 3011a and 3011b are kept in close contact with the third pair of yokes 303a and 303b. Namely, no gap is caused between the end surface 3011a and the yoke 303a and between the end surface 3011b and the yoke 303b by moving the yoke 301a. Consequently, the strength of the uniform magnetic field in the magnetic field generating space 100 is prevented from being reduced on the basis of the movement of the yoke 301a because the magnetic resistances between the end surfaces 3011a and the yoke 303a and between the end surface 3011b and the yoke 303b are substantially unchanged even when the yoke 301a is moved. For the same reason, a great change in the uniform magnetic field caused by varying the distance between the first pair of yokes 301a and 301b is prevented, as distinct from a case where gaps are created between the end surfaces 3011a and the yoke 303a and between the end surface 3011b and the yoke 303b by varying the distance between the first pair of yokes 301a and 301b. This means that the homogeneity of the uniform magnetic field can be easily adjusted as compared with a case where the gap is created.

The amounts of movement of the yokes 301a, 302a and 302b can be measured by the dial gauges 506a, 506b, 507a, 507b, 604a and 604b. Thus, The homogeneity of the uniform magnetic field can be adjusted while quantitatively measuring the amounts of movement of the yokes 301a, 302a and 302b.

Figure 5:
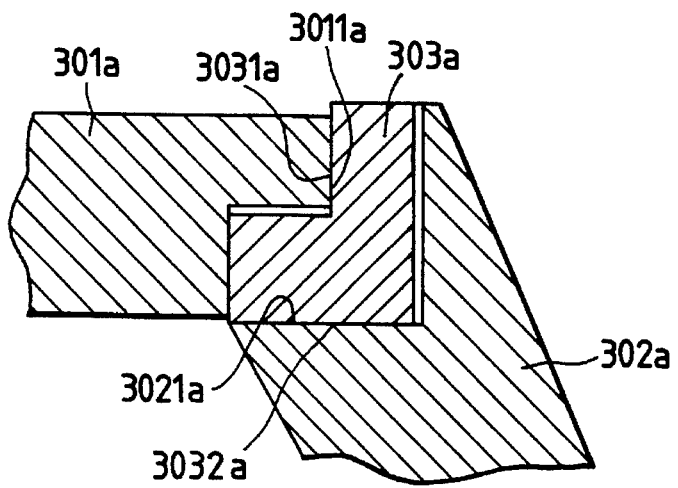
FIG. 5 is a sectional view of another example according to the present invention showing a coupling portion of one of a third pair of yokes shown in FIG. 3 and yokes brought into contact with the one of the third pair of yokes.

The yoke 303a may have a sectional shape as shown in FIG. 5 in place of that as shown in FIG. 3. In FIG. 5, the yoke 303a has an L-shaped cross-section with surfaces 3031a and 3032a being perpendicular to each other. The surface 3031a of yoke 303a is in close contact with a surface 3011a of the yoke 301a, while the surface 3032a of the yoke 303a is in close contact with a surface 3021a parallel to the surface 3022a (FIG. 3) of the yoke 302a. The yoke 303b may also have the same sectional shape as in FIG. 5, though not shown in FIG. 5. In this case, The yoke 303b has an L-shaped cross-section having surfaces 3031b and 3032b perpendicular to each other (not shown). The Surface 3031b of the yoke 303b is in close contact with a surface 3011b (not shown) of the yoke 301a parallel to the surface 3011a, while the surface 3032b of the yoke 303b is close contact with that surface 3021b (not shown) of the yoke 302b which is parallel to the surface 3022b (FIG. 3).

Although the yoke arrangement 300 has a hexagonal configuration as shown in FIGS. 1 and 3, it may have a rectangular configuration.

Since it is obvious that changes and modifications can be made in the above described details without departing from the nature and spirit of the invention, it is to be understood that the invention is not to be limited to the detailed described herein.

What is claimed is:

1. A magnetic field generating apparatus having a magnetic field generating space, comprising a permanent magnet arrangement for generating a magnetic field in the magnetic field generating space and a yoke arrangement forming magnetic circuits for generation of the magnetic field together with the permanent magnet arrangement, the yoke arrangement including:

(1) a first pair of yokes arranged so as to face each other;

(2) a second pair of yokes arranged so as to face each other and through which said first pair of yokes are magnetically coupled to each other;

(3) a third pair of yokes arranged between one end of one yoke of said first pair of yokes and one end of one yoke of said second pair of yokes and between the other end of said one yoke of said first pair of yokes and one end of the other yoke of said second pair of yokes, respectively; and (4) yoke moving means for independently moving said one yoke of said first pair of yokes and each yoke of said second pair of yokes with respect to said third pair of yokes, respectively.

2. A magnetic field generating apparatus according to claim 1, wherein said yoke moving means is provided with first and second yoke moving units, which are mounted on said third pair of yokes, respectively.

3. A magnetic field generating apparatus according to claim 2, wherein said first and second yoke moving units are nonmagnetic.

4. A magnetic field generating apparatus according to claim 3, wherein said yoke arrangement further comprises third and forth yoke moving units mounted on the other yoke of said first pair of yokes so as to move said second pair of yokes with respect to the other yoke of said first pair of yokes, respectively, the third and forth yoke moving units being nonmagnetic.

5. A magnetic field generating apparatus according to claim 2, wherein said yoke moving means further comprises means mounted on the other yoke of said first pair of yokes for moving said second pair of yokes with respect to said other yoke of said first pair of yokes, respectively.

6. A magnetic field generating apparatus according to claim 1, further including means for independently moving said second pair of yokes with respect to said other yoke of said first pair of yokes.

7. A magnetic field generating apparatus having a magnetic field generating space, comprising a permanent magnetic arrangement for generating a magnetic field having a predetermined direction in the magnetic field generating space and a yoke arrangement forming magnetic circuits for generation of the magnetic field together with the permanent magnet arrangement, the permanent magnet arrangement including a pair of permanent magnets arranged facing each other in the predetermined direction, and the yoke arrangement including:

(1) a first pair of yokes arranged so as to face each other, the first pair of yokes supporting said pair of permanent magnets, respectively;

(2) a second pair of yokes arranged so as to face each other and through which said first pair of yokes are magnetically coupled to each other;

(3) a third pair of yokes arranged between one end of one yoke of said first pair of yokes and one end of one yoke of said second pair of yokes and between the other end of said one yoke of said first pair of yokes and one end of the other yoke of said second pair of yokes, respectively; and (4) yoke moving means for independently moving said one yoke of said first pair of yokes in said predetermined direction and each of said second pair of yokes in a direction transverse to said predetermined direction with respect to said third pair of yokes, respectively.

8. A magnetic field apparatus according to claim 7, wherein said permanent magnet arrangement further includes a pair of permanent magnet units which are supported by said second pair of yokes so as to generate a magnetic field in the magnetic field space together with the pair of permanent magnets supported by said first pair of yokes.

9. A magnetic field generating apparatus according to claim 8, wherein each of said pair of permanent magnet units generate an additional magnetic field having said predetermined direction in said magnetic field generating space.

10. A magnetic field generating apparatus according to claim 9, wherein said pair of permanent magnet units are mounted on said inner surfaces of said second pair of yokes, said yoke arrangement having a convex hexagonal configuration in cross-section, each of said second pair of yokes being shaped to form a pair of adjacent slides of said convex hexagonal cross-section.

11. A magnetic field generating apparatus according to claim 9, wherein said yoke moving means is provided with first and second yoke moving units which are mounted on said third pair of yokes, respectively.

12. A magnetic field generating apparatus according to claim 11, wherein said first and second yoke moving units are nonmagnetic.

13. A magnetic field generating apparatus according to claim 12, wherein said yoke moving means further comprises means mounted on the other yoke of said first pair of yokes for moving said second pair of yokes with respect to said other yoke of said first pair of yokes, respectively.

14. A magnetic field generating apparatus according to claim 12, wherein said yoke moving means further comprises third and fourth yoke moving units mounted on the other yoke of said first pair of yokes so as to move said second pair of yokes with respect to the other yoke of said first pair of yokes, respectively, the third and forth yoke moving units being nonmagnetic.

15. A magnetic field generating apparatus according to claim 9, further including means for independently moving said second pair of yokes with respect to the other yoke of said first pair of yokes.

* * * * *